(12) United States Patent
Takasawa et al.

(10) Patent No.: US 9,363,900 B2
(45) Date of Patent: Jun. 7, 2016

(54) MOUNTING DEVICE AND METHOD OF MANUFACTURING THE SAME (71) Applicant: ULVAC, Inc., Chigasaki-shi (JP)

(72) Inventors: Satoru Takasawa, Chigasaki (JP); Shuhei Ichikawa, Chigasaki (JP); Isao Sugiura, Chigasaki (JP); Satoru Ishibashi, Chigasaki (JP); Junichi Nitta, Chigasaki (JP)

(73) Assignee: ULVAC, INC., Chigasaki-shi (JP)

( * ) Notice: Subject to any disclaimer, the term of this patent is extended or adjusted under 35 U.S.C. 154(b) by 0 days.

(21) Appl. No.: 14/693,159

(22) Filed: Apr. 22, 2015

(65) Prior Publication Data

US 2015/0230343 A1 Aug. 13, 2015

Related U.S. Application Data

(63) Continuation of application No. PCT/JP2014/062186, filed on May 2, 2014.

(30) Foreign Application Priority Data

May 13, 2013 (JP) .................................. 2013-101616

(51) Int. Cl.
*H05K 3/16* (2006.01)
*H05K 1/11* (2006.01)
(Continued)

(52) U.S. Cl.
CPC .. *H05K 3/16* (2013.01); *C22C 9/06* (2013.01); *C23C 14/205* (2013.01);
(Continued)

(58) Field of Classification Search
CPC ........... H05K 3/16; H05K 3/06; H05K 3/188; H05K 1/0366; H05K 1/115; H05K 2201/0209; H05K 2201/0317

USPC .............................. 174/255; 216/13; 205/186
See application file for complete search history.

(56) References Cited

U.S. PATENT DOCUMENTS 5,643,834 A * 7/1997 Harada ............... H01L 21/4835
257/E23.036
6,723,281 B1 * 4/2004 Ueno ........................ C22C 5/06
257/E23.162
(Continued)

FOREIGN PATENT DOCUMENTS

CN 102550138 A 7/2012
JP H03-236952 10/1991
(Continued)

OTHER PUBLICATIONS

Office Action issued on Dec. 3, 2015 for counterpart Chinese patent application No. 201480002581.0, with partial translation.
(Continued)

*Primary Examiner* — Timothy Thompson
*Assistant Examiner* — Charles Pizzuto
(74) *Attorney, Agent, or Firm* — Kratz, Quintos & Hanson, LLP (57) ABSTRACT

A mounting device in which a conductive film that is not separated is formed on a resin substrate. Alloy thin films, which contain more than 50% by atom of Cu, 5% by atom or more and 30% by atom or less of Ni, and 3% by atom or more and 10% by atom or less of Al, are formed on a base consisting of a resin so as to be brought into contact with a surface of the base by sputtering. Conductive films consisting of copper are formed on surfaces of the alloy thin films so as to obtain a wiring film having a two-layer structure and a metal plug filled in a connection hole. The alloy thin films have high adhesion to a resin; and hence, the wiring film and the metal plug are not separated.

6 Claims, 5 Drawing Sheets

(51) Int. Cl.
*H05K 3/18* (2006.01)
*H05K 1/03* (2006.01)
*C23F 1/02* (2006.01)
*H05K 3/06* (2006.01)
*C23C 14/20* (2006.01)
*C23C 14/34* (2006.01)
*C22C 9/06* (2006.01)
*H05K 3/38* (2006.01)
*H05K 3/46* (2006.01)
*H05K 3/10* (2006.01)

(52) U.S. Cl.
CPC .............. *C23C 14/3414* (2013.01); *C23F 1/02* (2013.01); *H05K 1/0366* (2013.01); *H05K 1/115* (2013.01); *H05K 3/06* (2013.01); *H05K 3/188* (2013.01); *H05K 3/388* (2013.01); *H05K 3/4644* (2013.01); *H01L 2224/16225* (2013.01); *H01L 2224/16227* (2013.01); *H01L 2924/15311* (2013.01); *H05K 3/108* (2013.01); *H05K 2201/0209* (2013.01); *H05K 2201/0317* (2013.01); *H05K 2201/09509* (2013.01); *H05K 2201/09563* (2013.01)

(56) References Cited

U.S. PATENT DOCUMENTS

| | | | |
|---|---|---|---|
| 2004/0187984 A1* | 9/2004 | Ueno | C22C 9/00 148/684 |
| 2005/0186768 A1* | 8/2005 | Sugaya | H05K 1/16 438/597 |
| 2007/0074790 A1* | 4/2007 | Yamakoshi | C22C 19/03 148/426 |
| 2011/0273075 A1* | 11/2011 | Goto | B32B 15/01 313/311 |
| 2012/0189826 A1 | 7/2012 | Hayashi | |

FOREIGN PATENT DOCUMENTS

| | | |
|---|---|---|
| JP | H08-332697 | 12/1996 |
| JP | 2004-193546 A1 | 7/2004 |
| JP | 2013-133489 A1 | 7/2013 |
| WO | WO 2009/131035 A1 | 10/2009 |

OTHER PUBLICATIONS

International Search Report for International Application No. PCT/JP2014/062186 dated Jul. 29, 2014.

* cited by examiner

PRIOR ART

MOUNTING DEVICE AND METHOD OF MANUFACTURING THE SAME

BACKGROUND OF THE INVENTION

1. Field of the Invention

The present invention generally relates to a mounting device including a patterned wiring film, a method of manufacturing the mounting device, and a sputtering target to be used in the manufacturing method.

2. Description of the Related Art

In recent years, semiconductor elements (such as, an LSI) have been mounted on a mounting substrate in which a plurality of single-layer substrates, each including a wiring film formed on a base of a resin, are laminated. Thus, there is a demand for a technology of forming a metal film having high adhesion to a surface of the resin. In particular, a copper thin film has an advantage of low resistance, but has low adhesion to the resin; and hence, an adhesion layer consisting of other metals is formed between the resin and the copper thin film.

Figure 7:
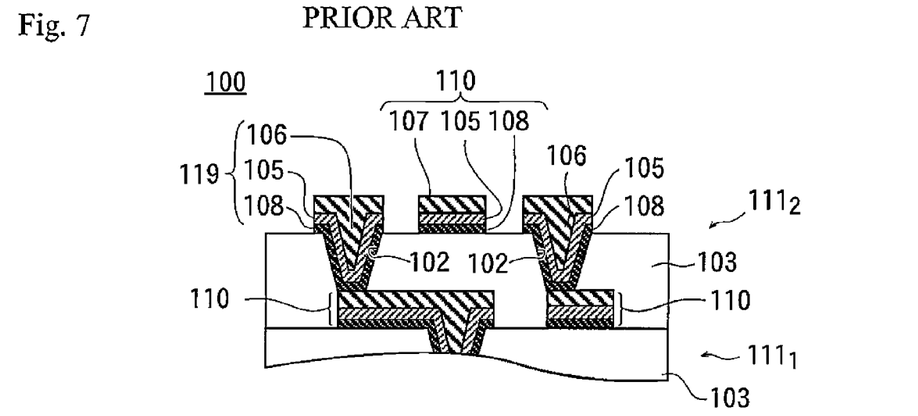
FIG. 7 is a view illustrating the related-art mounting device.

FIG. 7 illustrates such a related-art mounting device 100 in which a plurality of single-layer substrates 111$_1$ and 111$_2$ are laminated.

Each of the single-layer substrates 111$_1$ and 111$_2$ of the mounting device 100 includes a base 103 consisting of the resin; and a wiring film 110 is provided on a surface of the base 103. Further, the base 103 is provided with a connection hole 102, and a metal plug 119 for connecting the wiring films 110 of the laminated single-layer substrates 111$_1$ and 111$_2$ to each other is provided within the connection hole 102.

FIG. 7 illustrates a state in which the base 103 of the uppermost single-layer substrate 111$_2$ is bonded onto the single-layer substrate 111$_1$. The base 103 is provided with the connection hole 102, and a surface of the wiring film 110 of the lower single-layer substrate 111$_1$ is exposed from a bottom surface of the connection hole 102.

Figure 5A:
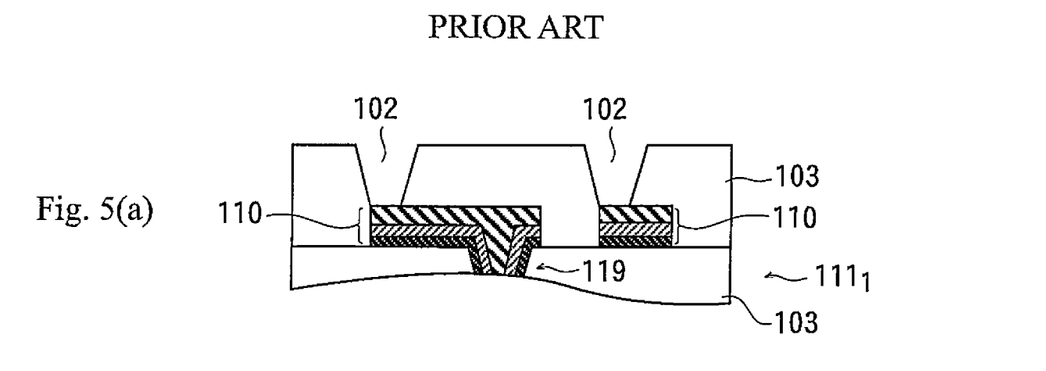
FIGS. 5(a) to 5(d) are views illustrating steps of manufacturing a related-art mounting device.
Figure 5B:
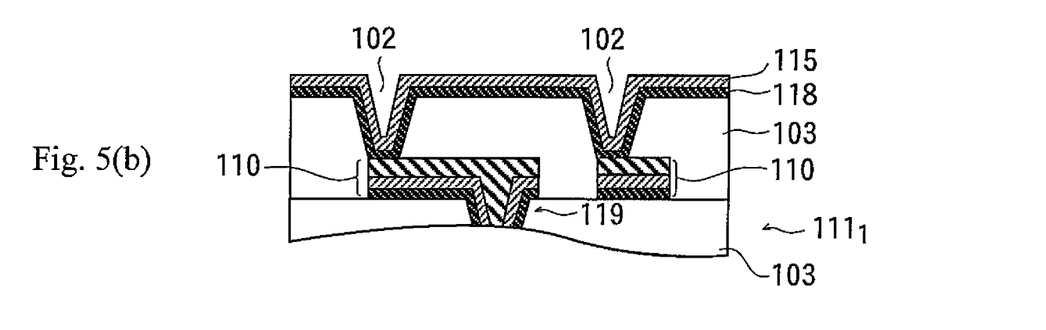

First, as illustrated in FIG. 5(b), a sputtering target containing a metal for adhesion (such, as Ti) is sputtered to form an adhesion layer 118 (such as, a Ti thin film), which is in contact with a surface of the base 103, an inner peripheral side surface of the connection hole 102, and the wiring film 110 exposed from the bottom surface illustrated in FIG. 5(a). Then, a sputtering target of copper is sputtered to form a seed layer 115 consisting of a copper thin film on a surface of the adhesion layer 118.

Figure 5C:
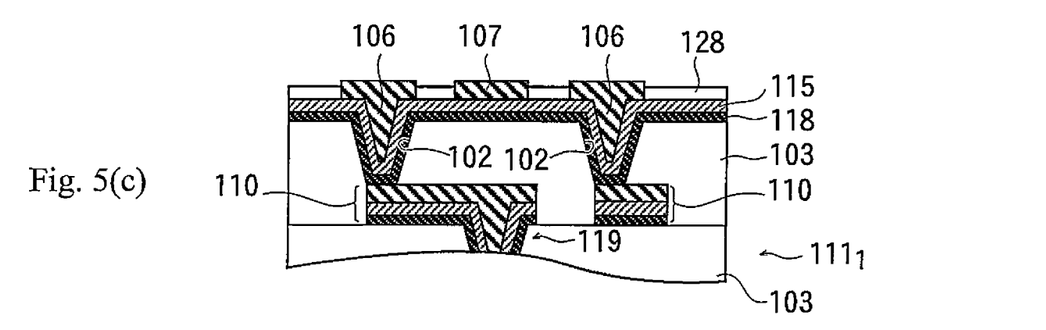

A patterned resist film is arranged on a surface of the seed layer 115 to expose the seed layer 115 within the connection hole 102 and the seed layer 115 at a predetermined position on the surface of the base 103, and immersed in a plating solution so that the exposed seed layer 115 is brought into contact with the plating solution; a voltage is applied between the seed layer 115 and the plating solution so that the seed layer 115 becomes negative charge with respect to the plating solution; copper is deposited on the surface of the seed layer 115 exposed by electroplating; and copper thin films 106 and 107 are formed within the connection hole 102 and on the surface of the base 103 as illustrated in FIG. 5(c). In this state, the copper thin films 106 and 107 are in contact with each other, the inside of the connection hole 102 is filled with the copper thin film 106 consisting of copper, and the copper thin films 106 and 107 are formed thicker than the seed layer 115. FIG. 3(c) illustrates a resist film 128.

Figure 5D:
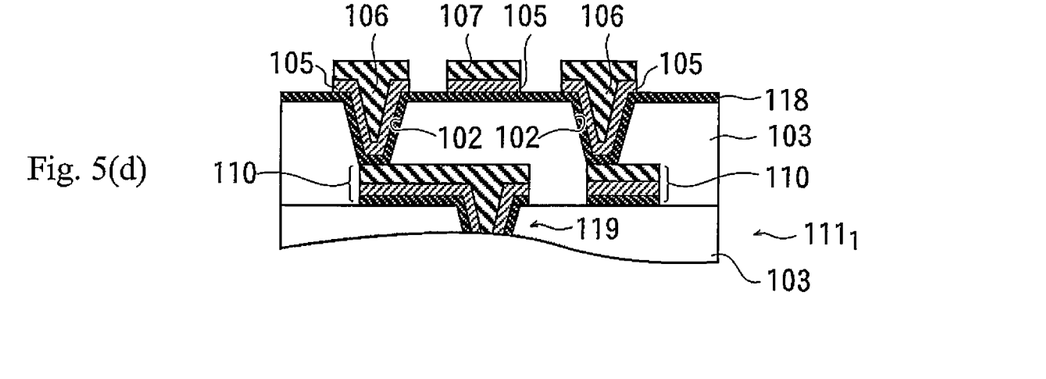

In this state, the adhesion layer 118 and the seed layer 115 include portions positioned under the copper thin films 106 and 107 and portions positioned under the resist film 128, and the resist film 128 is removed to expose the seed layer 115 positioned under the resist film 128. Thereafter, first, the resultant is immersed in a copper etchant so that the exposed seed layer 115 is removed by etching while leaving a patterned seed layer 105 under the copper thin films 106 and 107, thereby resulting in the adhesion layer 118 being exposed from a portion from which the seed layer 115 has been removed, as illustrated in FIG. 5(d).

Next, the resultant is immersed in a Ti etchant for dissolving Ti so that the exposed adhesion layer 118 is removed by etching while leaving an adhesion layer 108 positioned under the copper thin films 106 and 107 and the seed layer 105, thereby resulting in the base 103 being exposed from a portion from which the adhesion layer 118 has been removed, as illustrated in FIG. 7.

The metal plug 119 filled in the connection hole 102 is composed of the adhesion layer 108, the seed layer 105, and the copper thin film 106 within the connection hole 102; and the wiring film 110 is composed of the adhesion layer 108, the seed layer 105, and the copper thin film 107 on the surface of the base 103.

The adhesion between the copper thin films 106 and 107 and the resin exposed from the surface of the base 103 is low; and the copper thin films 106 and 107 are easily separated from the resin. However, the adhesion layer 108 consisting of the Ti thin film has high adhesion to the resin and has high adhesion also to the seed layer 105 consisting of the copper thin film; therefore, the seed layer 105 and the copper thin films 106 and 107 are not separated from the base 103.

However, as is understood from the above-described manufacturing steps, in order to form the copper thin films 106 and 107, it is necessary to form two layers including the adhesion layer 108 and the seed layer 105; and hence, the wiring film 110 becomes a three-layer structure, which results in the number of the manufacturing steps increases.

Further, the adhesion layer 118 contains a large amount of elements (such, as Ti) other than copper; and therefore, the adhesion layer 118 and the seed layer 115, which is the copper thin film, cannot be etched with the same etchant, which complicates the etching process. For example, see JPA H08-332697.

SUMMARY OF THE INVENTION

The present invention has been made in order to solve the above-described problems of the related art; and it is an object of the present invention to provide a technology capable of easily forming a conductive film that is not separated on a base having a resin exposed.

In order to solve the above problems, the present invention provides a mounting device, including: a base; and a wiring film formed to have a predetermined pattern while in contact with at least a resin exposed from a surface of the base, the mounting device being configured to mount an electronic component on the base by electrically connected to the wiring film, the wiring film including: an alloy thin film containing more than 50% by atom of Cu, 5% by atom or more and 30% by atom or less of Ni, and 3% by atom or more and 10% by atom or less of Al, the alloy thin film being in contact with the surface of the base; and a conductive film having conductivity and containing Cu in an amount larger than an amount of Cu in the alloy thin film, the conductive film being in contact with a surface of the alloy thin film.

Further, the present invention provides a mounting device wherein the base contains glass fibers, and the resin and the glass fibers are exposed from the surface of the base.

Further, the present invention provides a mounting device wherein a connection hole is formed so as to pass through a region between a front surface and a back surface of the base;

and the resin and the glass fibers are exposed from an inner peripheral surface of the connection hole; the alloy thin film is in contact with the inner peripheral surface of the connection hole; and the conductive film is filled into a region surrounded by the alloy thin film located on the inner peripheral surface of the connection hole so that the conductive film is in contact with the alloy thin film.

The present invention provides a method of manufacturing a mounting device including: a base; and a wiring film formed to have a predetermined pattern, the mounting device being configured to mount an electronic component on the base by electrically connected to the wiring film, the wiring film including: an alloy thin film being in contact with at least a resin exposed from a surface of the base; and a conductive film having conductivity and being arranged in contact with the alloy thin film, the method including: an alloy thin film forming process for forming the alloy thin film having the same composition as a composition of a sputtering target on the surface of the base by arranging the base in a vacuum atmosphere, introducing sputtering gas into the vacuum atmosphere, and sputtering the sputtering target that is arranged in the vacuum atmosphere and contains more than 50% by atom of Cu, 5% by atom or more and 30% by atom or less of Ni, and 3% by atom or more and 10% by atom or less of Al; and a conductive film forming process for forming the conductive film containing Cu in a volume content rate higher than a volume content rate of Cu in the alloy thin film on a surface of the alloy thin film.

Further, the present invention provides a method of manufacturing a mounting device wherein the conductive film forming process including a growth process for growing the alloy thin film by immersing the base having the alloy thin film formed thereon in a plating solution, and applying a negative voltage to the plating solution so that positive ions of a metal including copper, which are contained in the plating solution, are adhered to the surface of the alloy thin film.

Moreover, the present invention provides a method of manufacturing a mounting device including an etching process for patterning the alloy thin film by bringing the alloy thin film formed through the alloy thin film forming process into contact with one kind of an etchant, and dissolving and removing a portion of the alloy thin film, which is brought into contact with the etchant.

The alloy thin film is formed on the surface of the base; and the conductive film containing a large amount of copper is formed on the surface of the alloy thin film. Therefore, the conductive film is not brought into contact with the resin. Further, the conductive film has high adhesion to the alloy thin film; and hence, the conductive film is not separated from the base.

The alloy thin film can be etched with one kind of the etchant; and hence, the wiring film can be formed, in which the separately arranged conductive films are patterned through the use of one kind of the etchant during one etching process.

DETAILED DESCRIPTION OF THE PREFERRED EMBODIMENTS

Figure 1:
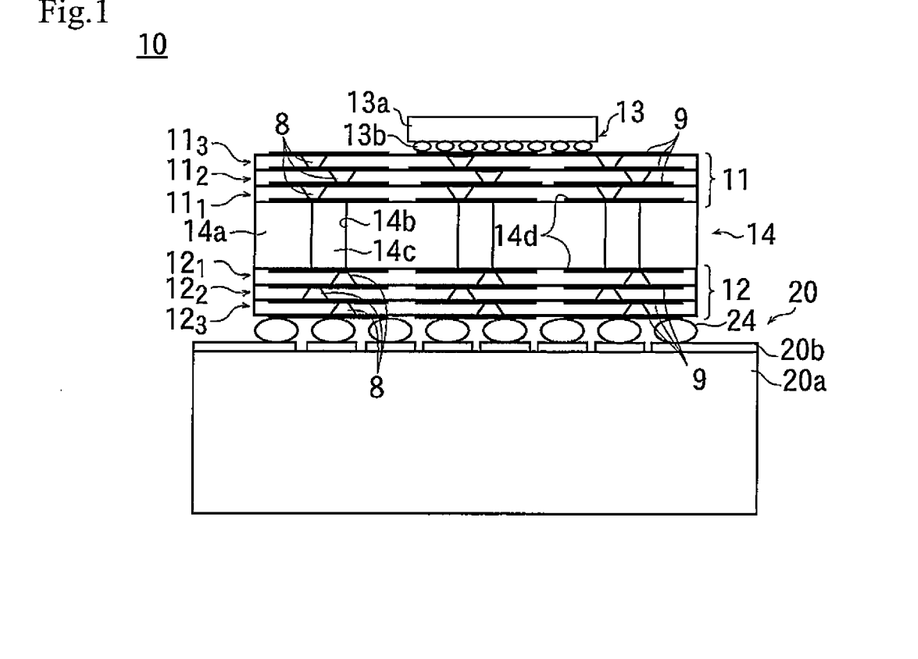
FIG. 1 is a view illustrating a mounting device of the present invention.

FIG. 1 illustrates a mounting device 10 according to the present invention and a mother board 20 having the mounting device 10 electrically connected thereto.

The mounting device 10 includes a support substrate 14, and a first multi-layer substrate 11 and a second multi-layer substrate 12, which are respectively arranged on both surfaces of the support substrate 14. The first multi-layer substrate 11 and the second multi-layer substrate 12 respectively include a plurality of single-layer substrates $11_1$ to $11_3$ and a plurality of single-layer substrates $12_1$ to $12_3$.

Figure 4A:
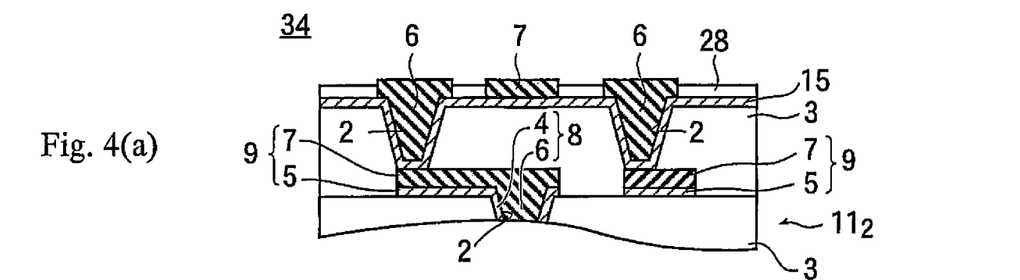
FIGS. 4(a) to 4(c) are views illustrating steps of manufacturing the mounting device of the present invention.

Of the respective single-layer substrates $11_1$ to $11_3$ and $12_1$ to $12_3$, a substrate closer to the support substrate 14 is referred to as a lower layer and a substrate farther from the support substrate 14 is referred to as an upper layer. In the next lower layer of the respective single-layer substrates $11_1$ to $11_3$ and $12_1$ to $12_3$, other single-layer substrates $11_1$, $11_2$ and $12_1$, $12_2$ or the support substrate 14 is positioned, and FIG. 4(c) illustrates the uppermost single-layer substrate $11_3$ of the first multi-layer substrate 11 and a part of the single-layer substrate $11_2$ in the next lower layer of the single-layer substrate $11_3$.

The respective single-layer substrates $11_1$ to $11_3$ and $12_1$ to $12_3$ have the same configuration; and each of the single-layer substrates $11_1$ to $11_3$ and $12_1$ to $12_3$ includes a plate-like base 3, a plurality of connection holes 2 formed in the base 3, a plurality of wiring films 9 arranged on a surface (excluding an inner peripheral surface and a bottom surface of the connection hole 2) on one side of the base 3, and a metal plug 8 filled in each connection hole 2. The connection hole 2 is a through-hole that is formed in the base 3 so as to pass through between a front surface and a back surface of the base 3.

The support substrate 14 includes a resin substrate 14a consisting of a resin, a plurality of support substrate through-holes 14b formed in the resin substrate 14a, connectors 14c each filled in an inside of the support substrate through-hole 14b, and a plurality of wiring films 14d arranged on both surfaces of the resin substrate 14a. The connector 14c has conductivity and is electrically connected to at least one wiring film 14d.

The metal plug 8 of each of the single-layer substrates $11_1$ to $11_3$ and $12_1$ to $12_3$ is electrically connected to a wiring film 9 of the base 3 having the connection hole 2 in which the metal plug 8 is positioned, on a surface of the base 3 on which the wiring film 9 is formed.

Then, the connection hole 2 of each of the single-layer substrates $11_1$ to $11_3$ and $12_1$ to $12_3$ is positioned on each wiring film 9 of the single-layer substrates $11_1$, $11_2$ and $12_1$, $12_2$ in the lower layer or on the wiring film 14d of the support substrate 14. The metal plug 8 of each of the single-layer substrates $11_1$ to $11_3$ and $12_1$ to $12_3$ is electrically connected to each wiring film 9 of the single-layer substrates $11_1$, $11_2$ and $12_1$, $12_2$ in the lower layer or to the wiring film 14d of the support substrate 14.

Thus, the wiring film 9 of each of the uppermost single-layer substrates $11_3$ and $12_3$ of the first multi-layer substrate 11 and the second multi-layer substrate 12 is electrically connected to either one of the wiring film 14d on one surface of the support substrate 14 or the wiring film 14d on the other surface of the support substrate 14; and the wiring films 14d on both the surfaces of the support substrate 14 are connected to each other through the connector 14c. Therefore, the wiring film 9 of the uppermost single-layer substrate $11_3$ and the wiring film 9 of the uppermost single-layer substrate $12_3$ are also electrically connected to each other through the metal plug 8 and the connector 14c.

The mother board 20 includes a mother board main body 20a and a wiring film 20b arranged on the mother board main body 20a.

A terminal 13b of a semiconductor device 13 is fixed to the wiring film 9 of the uppermost single-layer substrate $11_3$ of the first multi-layer substrate 11; and the wiring film 9 of the uppermost single-layer substrate $12_3$ of the second multi-layer substrate 12 is electrically connected to the wiring film 20b of the mother board 20 through a metal body 24.

The terminal 13b of the semiconductor device 13 is electrically connected to an integrated circuit of a semiconductor element arranged within a semiconductor device main body 13a; and hence, the integrated circuit is electrically connected to the wiring film 20b of the mother board 20 through the mounting device 10 and the metal body 24.

The metal plug 8 and the wiring film 9 of each of the single-layer substrates $11_1$ to $11_3$ and $12_1$ to $12_3$ are hereinafter described. First, the base 3 of each of the single-layer substrates $11_1$ to $11_3$ and $12_1$ to $12_3$ is composed of a substrate consisting of a resin or is composed of a composite material in which a cloth-like substrate having glass fibers knitted therein is impregnated with a resin.

Figure 6:
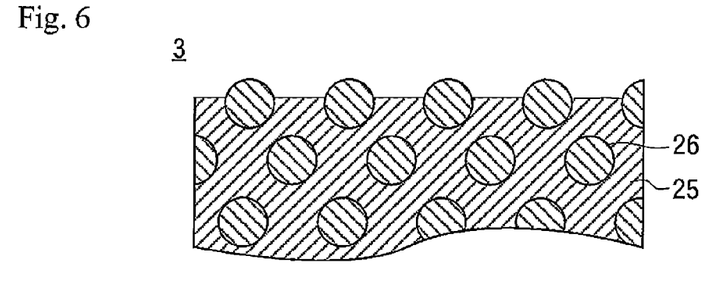
FIG. 6 is a view illustrating a base.

In the base 3 of FIG. 6, a resin 25 includes glass fibers 26, and the surface of the base 3 and the inner peripheral surface of the connection hole 2 are composed of a surface of the resin 25 and surfaces of the glass fibers 26 so that the resin 25 and the glass fibers 26 are exposed therefrom.

The metal plug 8 includes an alloy thin film 4 arranged in contact with the inner peripheral surface of the connection hole 2 and a conductive film 6 arranged in contact with a surface of the alloy thin film 4. Further, the wiring film 9 includes the alloy thin film 5 arranged in contact with the surface of the base 3 and a conductive film 7 arranged in contact with the surface of the alloy thin film 5.

The alloy thin films 4 and 5 are in contact with at least the resin composing the base 3 on the surface of the base 3 or the inner peripheral surface of the connection hole 2; and in the case where the base 3 contains glass fibers, the alloy thin films 4 and 5 are in contact with the resin and the glass fibers composing the base 3.

The steps of manufacturing the mounting device 10 are hereinafter described. In this case, it is assumed that the second multi-layer substrate 12 is already formed on one surface of the support substrate 14, and the single-layer substrates $11_1$ and $11_2$ other than the single-layer substrate $11_3$, which is to serve as the uppermost layer, are already formed and arranged on an opposite surface.

Figure 3A:
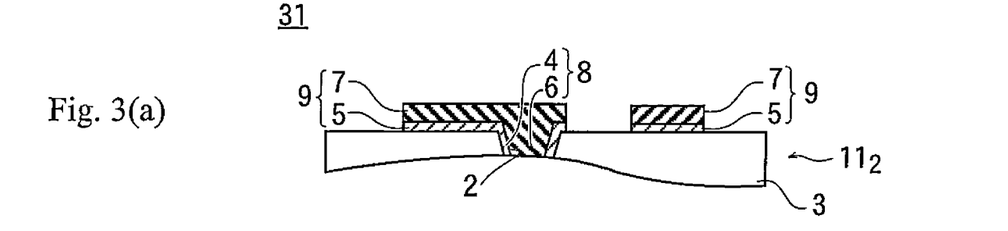
FIGS. 3(a) to 3(d) are views illustrating steps of manufacturing the mounting device of the present invention.

FIG. 3(a) illustrates an unfinished substrate 31 in the above-described state; and the uppermost single-layer substrate $11_2$ in the unfinished substrate 31 is exposed from a surface of the unfinished substrate 31.

Figure 3B:
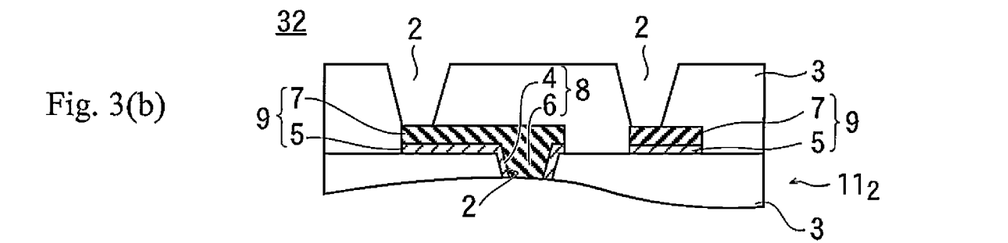
Figure 3C:
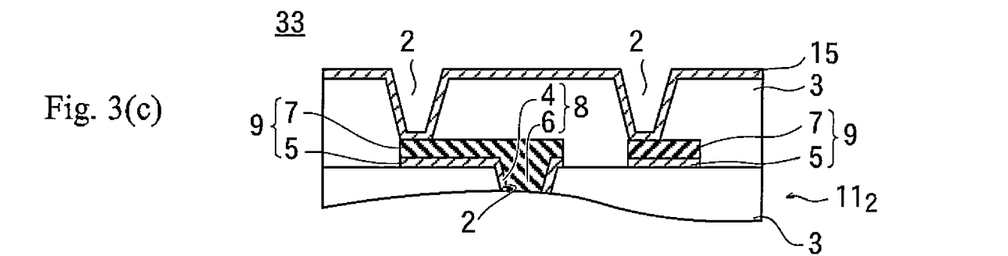

First, the base 3 is bonded onto a surface of the single-layer substrate $11_2$, as illustrated in FIG. 3(b). The base 3 to be bonded may include the connection hole 2 before being bonded or the connection hole 2 may be formed after the base 3 is bonded.

In an unfinished substrate 32 in this state, the wiring film 9 of the single-layer substrate $11_2$ in the next lower layer is exposed from a bottom surface of the connection hole 2 of the base 3 that is to serve as the uppermost layer. Next, the alloy thin films 4 and 5 are formed on the surface of the base 3 and the inner peripheral side surface and the bottom surface of the connection hole 2.

Figure 2:
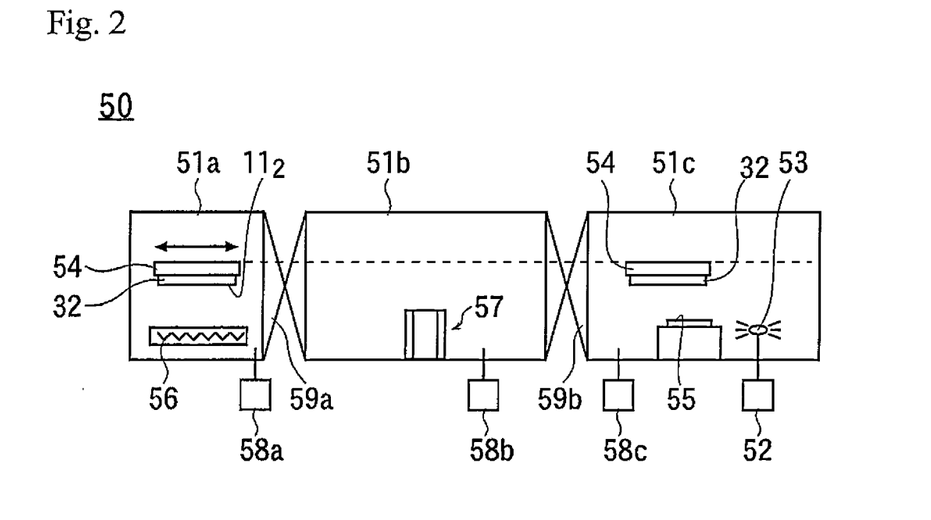
FIG. 2 is a view illustrating a sputtering device for forming the mounting device.

FIG. 2 illustrates a sputtering device 50 for forming the alloy thin films 4 and 5.

The sputtering device 50 includes a carrying-in-and-out chamber 51a, a pretreatment chamber 51b, and a film-formation chamber 51c.

Vacuum exhaust devices 58a to 58c are respectively connected to the carrying-in-and-out chamber 51a, the pretreatment chamber 51b, and the film-formation chamber 51c. A gate valve 59a between the carrying-in-and-out chamber 51a and the pretreatment chamber 51b and a gate valve 59b between the pretreatment chamber 51b and the film-formation chamber 51c are closed; and the vacuum exhaust devices 58b and 58c are operated so as to evacuate an inside of the pretreatment chamber 51b and an inside of the film-formation chamber 51c. Thus, a vacuum atmosphere is formed in each of the pretreatment chamber 51b and the film-formation chamber 51c.

A conveyance device 54 is arranged within the carrying-in-and-out chamber 51a; and the unfinished substrate 32 having the base 3 exposed therefrom is carried into the carrying-in-and-out chamber 51a and mounted to the conveyance device 54.

A door of the carrying-in-and-out chamber 51a is closed to shield the inside atmosphere thereof from the air; and the vacuum exhaust device 58a is operated to evacuate an inside of the carrying-in-and-out chamber 51a.

A heating device 56 is arranged within the carrying-in-and-out chamber 51a; and the unfinished substrate 32 mounted to the conveyance device 54 is heated by the heating device 56 in the course of evacuating.

After the unfinished substrate 32 is heated to a predetermined temperature, the gate valve 59a is opened, and the unfinished substrate 32 is moved from the inside of the carrying-in-and-out chamber 51a to the inside of the pretreatment chamber 51b together with the conveyance device 54.

An ion gun 57 is arranged within the pretreatment chamber 51b. When the ion gun 57 is supplied with rare gas (Ar in this case) from a gas introduction system after the gate valve 59a between the carrying-in-and-out chamber 51a and the pretreatment chamber 51b is closed, rare gas ions are generated within the ion gun 57. The rare gas ions generated are released into the pretreatment chamber 51b.

The base 3 of the unfinished substrate 32 is exposed to the vacuum atmosphere within the pretreatment chamber 51b, when being carried into the pretreatment chamber 51b; the base 3 is directed to the ion gun 57; and the rare gas ions are released. The rare gas ions are radiated to the surface of the base 3, the inner peripheral side surface of the connection hole 2, and a surface of the conductive film 7 of the lower single-layer substrate $11_2$ exposed from the bottom surface of the connection hole 2; and the irradiated portions are cleaned so that the active state is generated.

When the ions are radiated to those portions for a predetermined period of time, the pretreatment is finished, and the gate valve 59b between the pretreatment chamber 51b and the film-formation chamber 51c is opened. The unfinished substrate 32 subjected to the pretreatment is moved from the inside of the pretreatment chamber 51b to the inside of the film-formation chamber 51c together with the conveyance device 54; and the gate valve 59b is closed.

A target 55 is arranged within the film-formation chamber 51c.

The target 55 contains more than 50% by atom of Cu, 5% by atom or more and 30% by atom or less of Ni, and 3% by atom or more and 10% by atom or less of Al.

A gas release device 53 is provided within the film-formation chamber 51c; the inside of the film-formation chamber 51c is continuously evacuated by the vacuum exhaust device 58c; a gas supply device 52 supplies sputtering gas (rare gas such as argon gas) to the gas release device 53 while maintaining the vacuum atmosphere; the sputtering gas is released from the gas release device 53 into the film-formation chamber 51c; and a voltage is applied to the target 55 to generate plasma of the sputtering.

The surface of the base 3 subjected to the pretreatment faces the target 55; and when the target 55 is sputtered by the plasma generated, sputtering particles adhere to the surface of the base subjected to the pretreatment. Thus, an alloy thin film containing Cu, Ni, and Al in the same content rates as those of the target 55 is grown on the surface of the base 3.

An unfinished substrate 33 of FIG. 3(c) has an alloy thin film 15 formed thereon with a predetermined thickness. In the alloy thin film 15, the content rates of Cu, Ni, and Al are respectively more than 50% by atom, 5% by atom or more and 30% by atom or less, and 3% by atom or more and 10% by atom or less; that is, the alloy thin film 15 has the same composition as that of the target 55.

The alloy thin film 15 is in contact with the surface (excluding the inner peripheral surface of the connection hole 2) of the base 3, the inner peripheral surface of the connection hole 2, and the conductive film 7 formed on the bottom surface of the connection hole 2. On the bottom surface of the connection hole 2, the alloy thin film 15 is in contact with the wiring film 9 of the single-layer substrate $11_2$ in the next lower surface so as to be electrically connected. The wiring film 9 of the single-layer substrate $11_2$ in the next lower layer is composed of the alloy thin film 5 and the conductive film 7.

It is noted that the alloy thin film 15 in the uppermost layer is formed on the surface irradiated with the ions by the ion gun 57; and hence, the adhesion strength is higher than that in the case where the ions are not radiated.

After the alloy thin film 15 is formed to have a predetermined thickness, the application of a voltage to the target 55 and the introduction of sputtering gas are stopped; and thus, sputtering is completed.

Then, the gate valves 59a and 59b are opened; and the unfinished substrate 33 having the alloy thin film 15 formed thereon is moved to the carrying-in-and-out chamber 51a, in which the vacuum atmosphere is formed, through the pretreatment chamber 51b.

After the gate valves 59a and 59b are closed, gas is introduced into the carrying-in-and-out chamber 51a, and pressure inside of the carrying-in-and-out chamber 51a becomes atmospheric pressure. Then, the unfinished substrate 33 having the alloy thin film 15 formed thereon is taken out from the carrying-in-and-out chamber 51a.

Figure 3D:
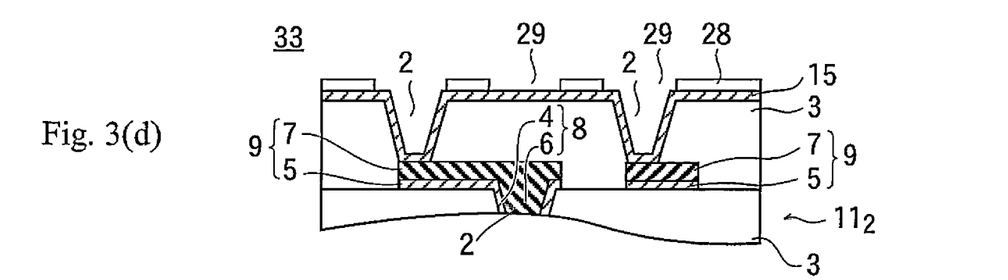

Then, as illustrated in FIG. 3(d), a patterned resist film 28 is arranged on a surface of the alloy thin film 15.

The resist film 28 has openings 29 formed therein above each of the connection holes 2 of the base 3 in the uppermost layer and above a predetermined position of the alloy thin film 15 formed on the surface of the base 3. The alloy thin film 15 arranged on the bottom surface and the inner peripheral side surface of each of the connection holes 2 or the alloy thin film 15 positioned on the surface of the base 3 is exposed from a bottom surface of the opening 29.

A conductive film, which consists of a material containing Cu in a content rate (% by atom) higher than that of the alloy thin film 15 and has a small resistivity, is formed on the surface of the alloy thin film 15 exposed from the bottom surface of the opening 29 of the unfinished substrate 33 in the above-described state, by contact with the alloy thin film 15.

A specific method of forming the conductive film is carried out in, for example, the following manner. The unfinished substrate 33, in which the alloy thin film 15 is exposed from the bottom surface of the opening 29 of the resist film 28 and from the predetermined position of the surface of the base 3, is immersed in a plating solution containing copper ions; the exposed alloy thin film 15 is brought into contact with the plating solution; and a copper electrode and the alloy thin film 15, which are immersed in the plating solution, are connected to a power source. The power source is operated to apply a voltage between the alloy thin film 15 and the plating solution through the copper electrode; thereby, causing positive metal ions in the plating solution to adhere to a portion in contact with the plating solution of the alloy thin film 15, so as to grow a conductive film containing copper in an amount larger than that of the alloy thin film 15. Thus, an unfinished substrate 34 is formed, in which the conductive films 6 and 7 are formed on the bottom surface of the opening 29 of the connection hole 2 and on the bottom surface of the opening 29 on the surface of the base 3, as illustrated in FIG. 4(a).

In general, the growth rate is higher in electroplating than in sputtering, and the thickness of the conductive films 6 and 7 formed by electroplating is larger than the thickness of the alloy thin film 15 formed by sputtering. In the unfinished substrate 34, the conductive film 6 formed on the surface of the alloy thin film 15 in the connection hole 2 is filled in the inside of the connection hole 2, and an upper portion of the conductive film 6 is positioned above the surface of the alloy thin film 15 formed on the surface of the base 3.

Figure 4B:
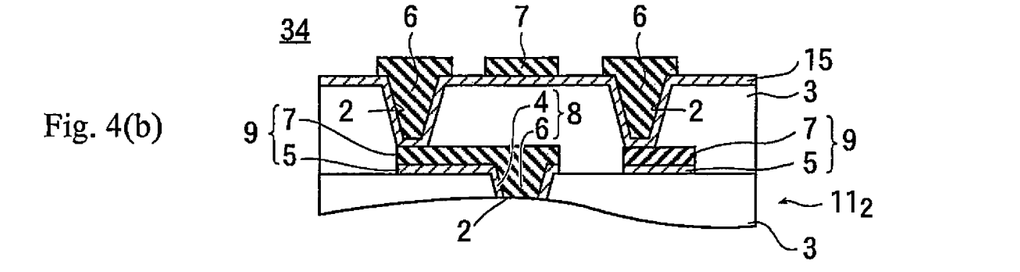
Figure 4C:
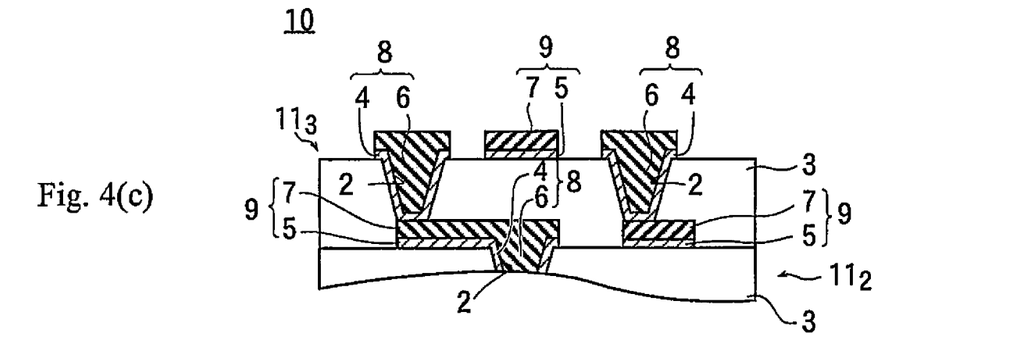

Next, as illustrated in FIG. 4(b), when the resist film 28 is removed, the alloy thin film 15 is exposed between the portions in which the conductive films 6 and 7 are exposed.

The conductive film 6 within the connection hole 2 is connected to the conductive film 7 formed on the surface of the base 3. Although there are some conductive films which are mutually separated among the conductive films 7 formed on the surface of the base 3, the conductive films 6 and 7 are in the state where they are electrically connected to each other through the alloy thin film 15 under the condition that the resist film 28 is removed.

Then, when the unfinished substrate 34 in the above-described state is immersed in an etchant for etching copper, a portion of the alloy thin film 15, which is exposed and brought into contact with the etchant, is dissolved in the etchant and removed by etching. Consequently, as illustrated in FIG. 4(c), in the portion from which the alloy thin film 15 has been removed, the surface of the base 3 positioned under the alloy thin film 15 is exposed, and the uppermost single-layer substrate $11_3$ having the conductive films 6 and 7 patterned thereon is formed.

In the respective single-layer substrates $11_1$ to $11_3$ and $12_1$ to $12_3$, in the connection hole 2, the metal plug 8 is composed of the conductive film 6 within the connection hole 2 and the alloy thin film 4 positioned between the conductive film 6 and the inner peripheral surface of the connection hole 2. On the base 3, the wiring film 9 is composed of the conductive film 7 and the alloy thin film 5 positioned under the conductive film 7. A space surrounded by the alloy thin film 4 formed on the inner peripheral surface of the connection hole 2 is filled with the conductive film 6; and thus, the connection hole 2 is filled with the metal plug 8.

A thin film of pure copper has poor adhesion to the resin exposed from the surface of the base 3.

In the present invention, when elements other than Cu is contained in a thin film material containing more than 50% by atom of Cu of the alloy thin films 4 and 5 in contact with the resin and the adhesion strength is measured, as described in the following experiment, the thin film material containing 5% by atom or more and 30% by atom or less of Ni and 3% by atom or more and 10% by atom or less of Al has higher adhesion to the resin, compared to adhesion of a thin film of pure copper or copper oxide.

In particular, with respect to the adhesion to an epoxy resin, even when Mg is contained in the copper thin film, the adhesion is not enhanced, and even when oxygen is contained in the copper thin film, the adhesion also is not enhanced. However, the adhesion between the alloy thin films 4 and 5 and the resin is enhanced in the wiring film 9 according to the present invention.

Further, since the content rate of copper in the alloy thin films 4 and 5 is more than 50% by atom, the adhesion to a thin film consisting of pure copper is high, and the metal plug 8 and the wiring film 9 are not separated from the base 3. Further, the conductive films 6 and 7 contain copper in a content rate higher than that of the alloy thin films 4 and 5; and hence, the conductive films 6 and 7 are not separated from the alloy thin films 4 and 5.

EXAMPLE

A Ni pellet and an Al pellet were arranged on a copper target; and alloy thin films having different compositions were each formed on a pretreated surface of the base 3 consisting of an epoxy resin containing glass fibers by sputtering. Then, a conductive film of pure copper was formed on a surface of each of the alloy thin films by electroplating. The adhesion of a wiring film formed of two layers including the alloy thin film and the conductive film was measured. A composition of the alloy thin film included impurities and copper, which were inevitably contained, besides Ni and Al; and the content of the impurities was small. Therefore, the alloy thin film was considered to be composed of copper, besides Ni and Al. The thickness of the alloy thin film was set to 500 nm; and the thickness of the conductive film was set to 30 μm.

The adhesion was determined by cutting a part of the base 3 on which the wiring film consisting of the alloy thin film and the conductive film was formed, holding an end of the wiring film separated from the base 3 in the cut part, and measuring a force required to have the wiring film completely separated when the end is raised at a constant speed (20 mm/min). When the force thus measured is defined as adhesion strength, Table 1 below shows measurement results of the adhesion strength of each of the alloy thin films having the compositions in the experiment of this example, and the column labeled "Measurement value" in Table 1 represents a value per unit width (cm) of the alloy thin film.

TABLE 1

Measurement results of adhesion strength

| Content rate of added elements (% by atom) | | Peel strength | Measurement value |
|---|---|---|---|
| Ni | Al | | |
| 0 | 0 | X | 220 |
|   | 5 | X | 300 |
|   | 10 | X | 330 |
|   | 15 | Δ | 460 |

TABLE 1-continued

Measurement results of adhesion strength

| Content rate of added elements (% by atom) | | Peel strength | Measurement value |
|---|---|---|---|
| Ni | Al | | |
| 5 | 0 | X | 240 |
|   | 1 | Δ | 610 |
|   | 3 | ○ | 810 |
|   | 5 | ○ | 840 |
|   | 10 | ○ | 850 |
|   | 15 | Δ | 730 |
| 15 | 0 | X | 250 |
|   | 1 | Δ | 650 |
|   | 3 | ○ | 820 |
|   | 5 | ○ | 910 |
|   | 10 | ○ | 880 |
|   | 15 | Δ | 740 |
| 30 | 0 | Δ | 270 |
|   | 1 | Δ | 680 |
|   | 3 | ○ | 800 |
|   | 5 | ○ | 820 |
|   | 10 | ○ | 800 |
|   | 15 | Δ | 750 |
| 50 | 0 | X | 300 |
|   | 3 | X | 450 |
|   | 5 | Δ | 530 |
|   | 10 | Δ | 610 |
|   | 15 | X | 320 |

In the case of the wiring film in which a Ti thin film was used as the adhesion layer and a copper film was formed on the Ti thin film, the adhesion strength was 800 gf/cm.

In the column labeled "Peel strength" in Table 1, in order to define the wiring film equal to or better than the wiring film using the Ti thin film as a satisfactory product, "○" is described to indicate that the product can be used in the case where the value in the column labeled "Measurement value" is 800 or more. Further, "×" is described to indicate that the product cannot be used in the case where the value in the column labeled "Measurement value" is 450 or less, and "Δ" is described to indicate that the product may not be used in the case where the value in the column "Measurement value" is more than 450 and less than 800.

It is noted that, the case where the content rates of the added elements Ni and Al are 0% by atom corresponds to the case of an alloy thin film consisting of a thin film of pure copper (measurement value is 220 gf/cm).

It is understood from the measurement results of Table 1 that, in order for the value of peel strength to reach 800 or more, it is necessary that Ni would be 5% by atom or more and 30% by atom or less, and Al would be 3% by atom or more and 10% by atom or less.

Figure 8:
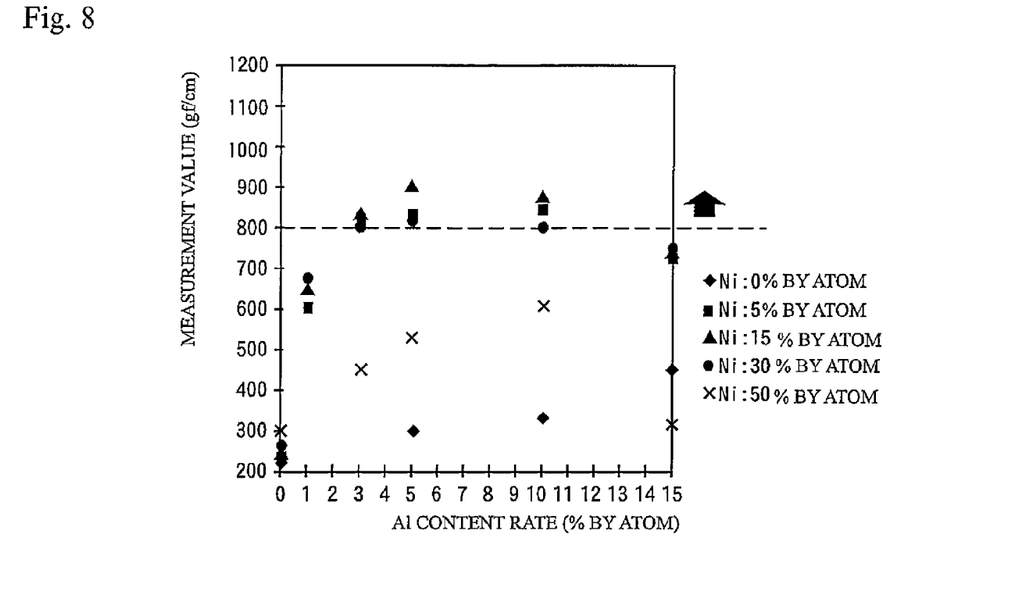
FIG. 8 is a graph showing measurement values of adhesion strength.

FIG. 8 is a graph showing the measurement results of Table 1; and compositions indicated by dots located at positions on and above the broken line are included in the present invention.

It is noted that, as a comparative example, when the adhesion strength of a wiring film consisting of 2% by atom of Mg, 8% by atom of Al, and the balance Cu was measured, the measurement result was 320 gf/cm. From this result, it is understood that, compared to the alloy film having Al and Ni added thereto, the adhesion strength was less increased in the alloy film having Al and Mg added thereto.

It is noted that, although the above base 3 was a hard substrate consisting of an epoxy resin containing glass fibers, the base 3 may consist of a resin other than the epoxy resin. Further, a base that is free of glass fibers and contains a resin is also included in the base 3 of the present invention. Further, the base 3 may be a film consisting of a soft resin and having flexibility.

This present invention includes a sputtering target including an alloy composition containing more than 50% by atom of Cu, 5% by atom or more and 30% by atom or less of Ni, and 3% by atom or more and 10% by atom or less of Al, the sputtering target being sputtered to form an alloy thin film having the alloy composition on the surface of the base having the resin exposed therefrom.

REFERENCE NUMERALS IN THE DRAWINGS

2 connection hole
3 base
4,5 alloy thin film
8 metal plug
9 wiring film
10 mounting device
55 target

What is claimed is:

1. A mounting device, comprising:
   a base; and
   a wiring film formed to have a predetermined pattern while in contact with at least a resin exposed from a surface of the base,
   the mounting device being configured to mount an electronic component on the base by electrically connected to the wiring film,
   the wiring film comprising:
      an alloy thin film containing more than 50% by atom of Cu, 5% by atom or more and 30% by atom or less of Ni, and 3% by atom or more and 10% by atom or less of Al, the alloy thin film being in contact with the surface of the base; and
      a conductive film having conductivity and containing Cu in an amount larger than an amount of Cu in the alloy thin film, the conductive film being in contact with a surface of the alloy thin film.

2. A mounting device according to claim 1,
   wherein the base contains glass fibers, and
   wherein the resin and the glass fibers are exposed from the surface of the base.

3. A mounting device according to claim 1,
   wherein a connection hole is formed so as to pass through a region between a front surface and a back surface of the base, and the resin and the glass fibers are exposed from an inner peripheral surface of the connection hole,
   wherein the alloy thin film is in contact with the inner peripheral surface of the connection hole, and
   wherein the conductive film is filled into a region surrounded by the alloy thin film located on the inner peripheral surface of the connection hole so that the conductive film is in contact with the alloy thin film.

4. A method of manufacturing a mounting device,
   the mounting device comprising: a base; and a wiring film formed to have a predetermined pattern, the mounting device being configured to mount an electronic component on the base by electrically connected to the wiring film,
   the wiring film comprising:
      an alloy thin film being in contact with at least a resin exposed from a surface of the base; and
      a conductive film having conductivity and being arranged in contact with the alloy thin film,
   the method comprising:
   an alloy thin film forming process for forming the alloy thin film having the same composition as a composition of a sputtering target on the surface of the base by arranging the base in a vacuum atmosphere, introducing sputtering gas into the vacuum atmosphere, and sputtering the sputtering target that is arranged in the vacuum atmosphere and contains more than 50% by atom of Cu, 5% by atom or more and 30% by atom or less of Ni, and 3% by atom or more and 10% by atom or less of Al; and
   a conductive film forming process for forming the conductive film containing Cu in a volume content rate higher than a volume content rate of Cu in the alloy thin film on a surface of the alloy thin film.

5. A method of manufacturing a mounting device according to claim 4, wherein the conductive film forming process comprising a growth process for growing the alloy thin film by immersing the base having the alloy thin film formed thereon in a plating solution, and applying a negative voltage to the plating solution so that positive ions of a metal including copper, which are contained in the plating solution, are adhered to the surface of the alloy thin film.

6. A method of manufacturing a mounting device according to claim 5, further comprising an etching process for patterning the alloy thin film by bringing the alloy thin film formed through the alloy thin film forming process into contact with one kind of an etchant; and dissolving and removing a portion of the alloy thin film, which is brought into contact with the etchant.

* * * * *